United States Patent
Zhang et al.

(10) Patent No.: US 10,910,072 B1
(45) Date of Patent: Feb. 2, 2021

(54) ACCURATE SELF-CALIBRATED NEGATIVE TO POSITIVE VOLTAGE CONVERSION CIRCUIT AND METHOD

(71) Applicant: SanDisk Technologies LLC, Addison, TX (US)

(72) Inventors: Xiaofeng Zhang, San Jose, CA (US); Steve Choi, Danville, CA (US); Gyusung Park, Saint Paul, MN (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/717,168

(22) Filed: Dec. 17, 2019

(51) Int. Cl.
| | |
|---|---|
| *G11C 16/30* | (2006.01) |
| *H03F 3/45* | (2006.01) |
| *H03F 1/02* | (2006.01) |
| *G11C 16/04* | (2006.01) |

(52) U.S. Cl.
CPC .......... *G11C 16/30* (2013.01); *G11C 16/0483* (2013.01); *H03F 1/0211* (2013.01); *H03F 3/45071* (2013.01); *H03F 2203/45151* (2013.01); *H03F 2203/45156* (2013.01); *H03F 2203/45514* (2013.01); *H03F 2203/45528* (2013.01); *H03F 2203/45551* (2013.01)

(58) Field of Classification Search
CPC ..................................................... G11C 16/30
USPC ..................................................... 365/189.09
See application file for complete search history.

(56) References Cited

U.S. PATENT DOCUMENTS

| | | | | |
|---|---|---|---|---|
| 3,973,089 | A * | 8/1976 | Puckette | H04B 1/52 379/404 |
| 4,833,418 | A * | 5/1989 | Quintus | H03F 3/45475 330/258 |
| 4,860,356 | A * | 8/1989 | Visser | H04B 1/66 704/233 |
| 6,084,387 | A | 7/2000 | Kaneko et al. | |
| 8,395,434 | B1 | 3/2013 | Nguyen et al. | |
| 9,148,094 | B1 * | 9/2015 | Swoboda | H03F 3/08 |
| 9,653,126 | B2 | 5/2017 | Nguyen et al. | |
| 2006/0245174 | A1 * | 11/2006 | Ashdown | H05B 45/28 362/85 |
| 2007/0159891 | A1 | 7/2007 | Tu et al. | |
| 2016/0277689 | A1 * | 9/2016 | Gesset | H04N 5/3559 |

OTHER PUBLICATIONS

U.S. Appl. No. 16/717,149, filed Dec. 17, 2019.

* cited by examiner

*Primary Examiner* — Min Huang
(74) *Attorney, Agent, or Firm* — Vierra Magen Marcus LLP

(57) ABSTRACT

Apparatuses and techniques are described for calibrating a negative voltage source. A ground voltage is applied to a multi-stage amplifier from the negative voltage source while an offset voltage measurement (OVM) is made at the output of the multi-stage amplifier. The OVM is recorded and subsequently used by a calibration circuit when the negative voltage source applies a range of negative voltages to the input of the multiple stage amplifier. The calibration circuit subtracts the OVM from measurements obtained at the output of the multi-stage amplifier to obtain corrected measurements, and uses the corrected measurements to calibrate the negative voltage source, e.g., by adjusting a relationship between digital values input to the negative voltage source and the output voltages.

20 Claims, 11 Drawing Sheets

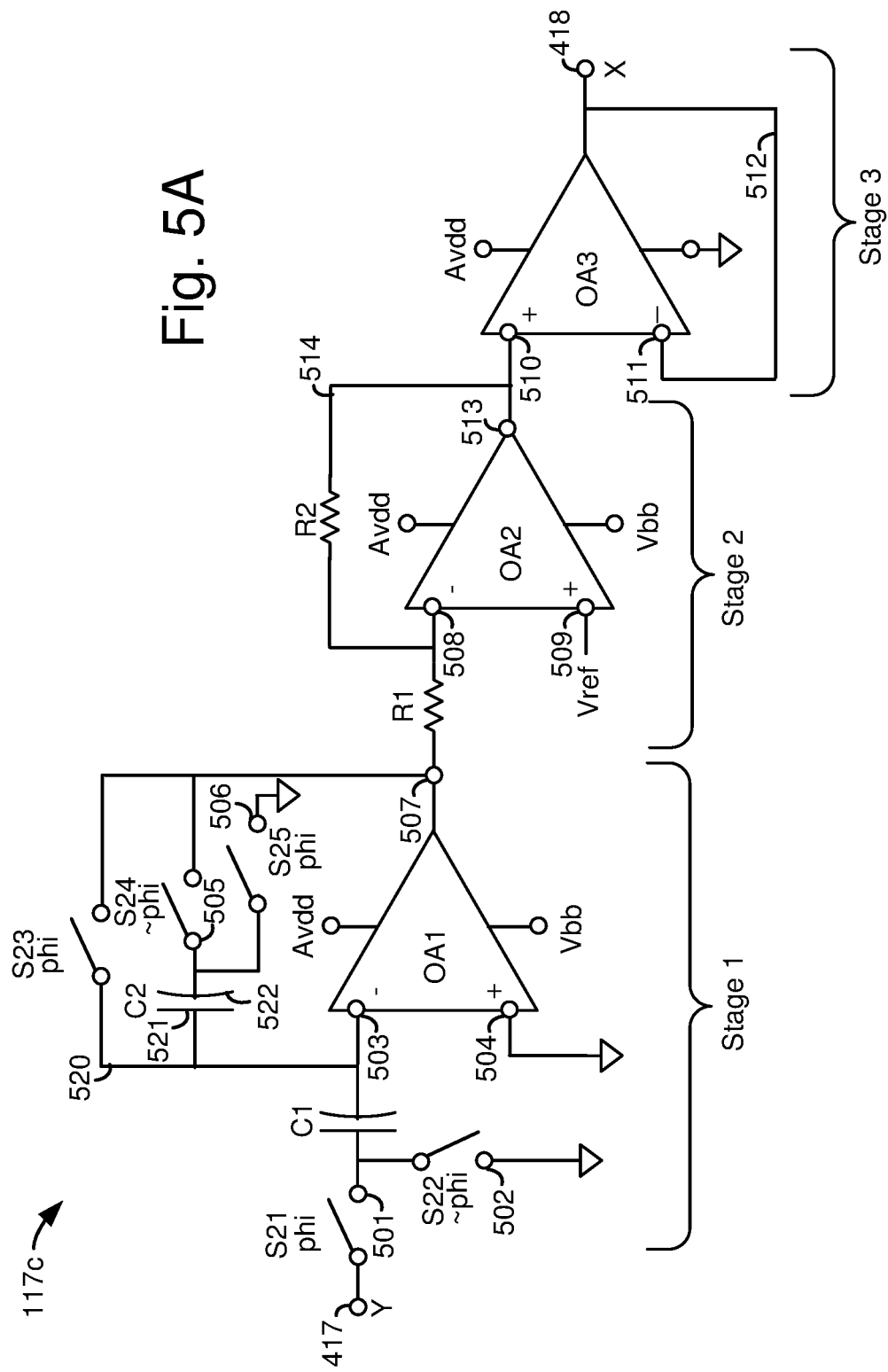

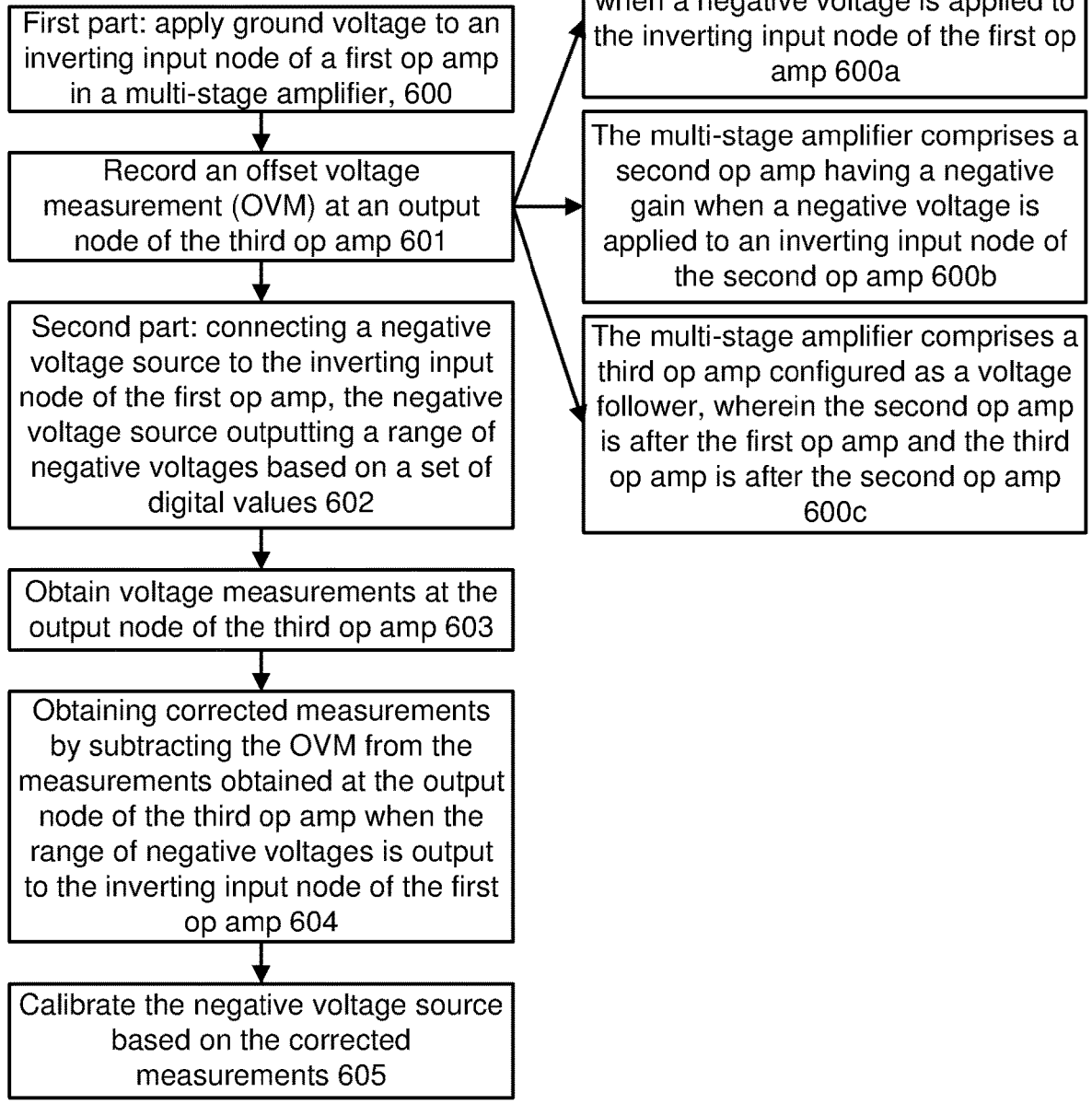

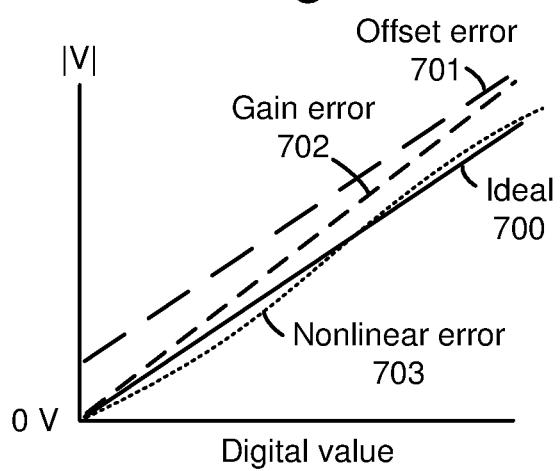
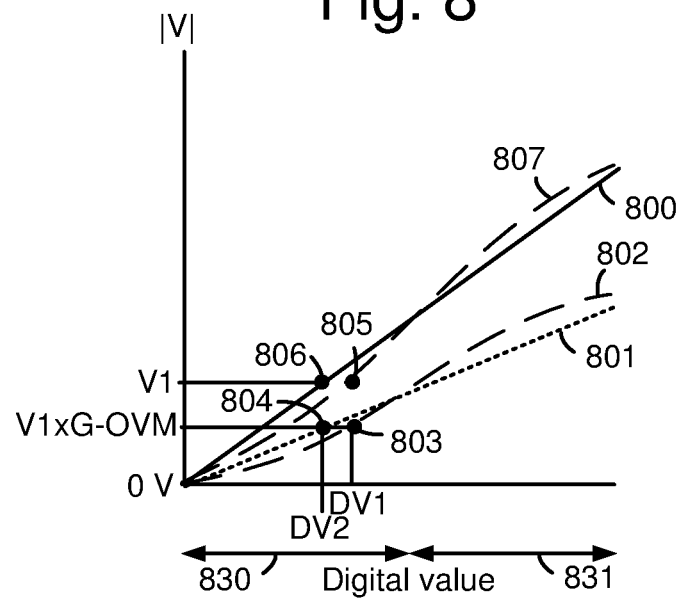

US 10,910,072 B1

ACCURATE SELF-CALIBRATED NEGATIVE TO POSITIVE VOLTAGE CONVERSION CIRCUIT AND METHOD

BACKGROUND

The present technology relates to the operation of semiconductor devices.

Semiconductor devices, including memory devices, have become more popular for use in various electronic devices. For example, non-volatile semiconductor memory is used in cellular telephones, digital cameras, personal digital assistants, mobile computing devices, non-mobile computing devices and other devices.

A semiconductor device includes voltage sources which supply voltages to the components of the device. For example, a memory device includes voltage sources which supply voltages to the memory cells such as for program, read and erase operations. However, various challenges are presented in calibrating and operating such voltage sources.

BRIEF DESCRIPTION OF THE DRAWINGS

FIG. 5A depicts an example configuration of the multi-stage amplifier 117c of FIGS. 1 and 4.

FIG. 6A depicts an example process for calibrating the negative voltage source 117b of FIGS. 1 and 4.

FIG. 7 depicts an example plot of a voltage magnitude versus a digital value for a voltage source, showing different types of errors.

FIG. 8 depicts an example plot of a voltage magnitude versus a digital value for the negative voltage source 117b of FIGS. 1 and 4, in an example process for calibrating the negative voltage source which is consistent with step 612 of FIG. 6B.

DETAILED DESCRIPTION

Figure 1:
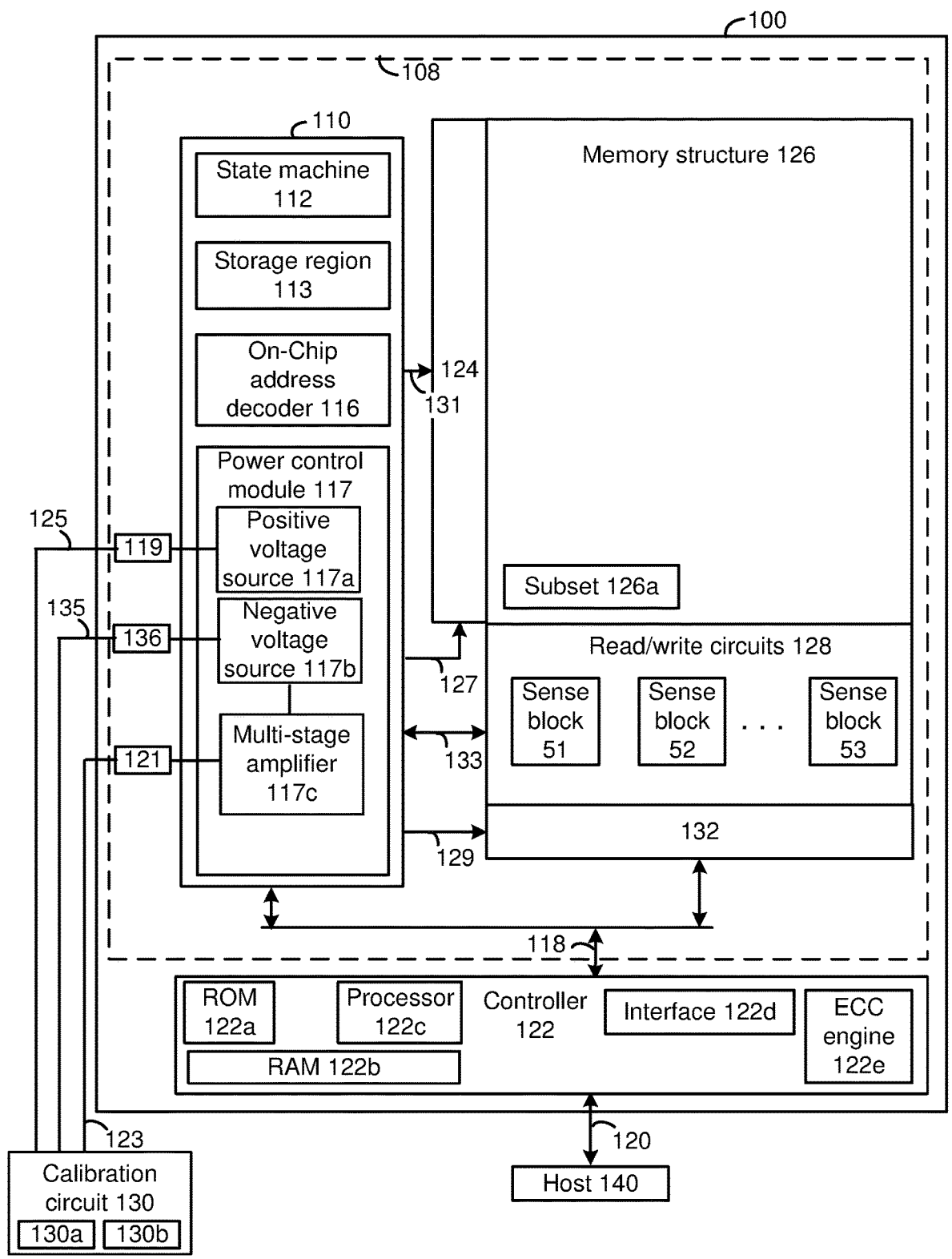
FIG. 1 is a block diagram of an example storage device which includes a negative voltage source.

Apparatuses and techniques are described for calibrating a negative voltage source.

In memory devices and other semiconductor devices, various voltage sources or drivers can be used to provide appropriate voltages to components in the device. For example, in a memory device, voltages may be provided to word lines, bit lines, and other control lines. The voltages should be accurately controlled to ensure proper operation of the device. Typically, to minimize complexity, voltage sources provide a positive voltage output. However, negative voltages are desired in some cases. For example, to read a memory cell having a negative threshold voltage, it may be desired to apply a negative read voltage to a word line.

The presence of a negative voltage source adds complexity partly due to the need to calibrate the negative voltage source. The calibration can occur, e.g., at the time the semiconductor device is tested at the facility of the manufacturer before it is released to the end user. The calibration process can involve using automated test equipment (ATE) which is connected to the semiconductor chip to measure and evaluate voltages generated by voltage sources on the chip. However, the ATE is typically configured for measuring positive voltages.

Techniques provided herein address the above and other issues. In one aspect, a negative voltage source can be switched between a calibration mode and an operational mode. In the calibration mode, the voltage output of the negative voltage source is provided to a multi-stage amplifier which can provide a negative to positive voltage conversion. In the operational mode, the voltage output of the negative voltage source is provided to an on-chip component such as a control line for a memory array. The multi-stage amplifier includes a first stage with a first operation amplifier (op amp) having a positive gain when a negative voltage is applied to the inverting input node of the first op amp. The first op amp may have a positive gain of less than one, for example. A following second stage has a second op amp having a negative gain when a negative voltage is applied to an inverting input node of the second op amp. This allows the second op amp to convert a range of negative voltages from the negative voltage source to positive voltages. However, the second op amp also has a positive gain when a positive voltage less than a specified voltage is applied to the inverting input node of the second op amp. This allows the second op amp to pass through a small positive offset voltage of the first op amp without changing its polarity. The multi-stage amplifier therefore provides a positive voltage output to the calibration circuit so that the calibration circuit can avoid the complexity of measuring negative voltages. A following third stage has a third op amp with a unity gain, and helps isolate the multi-state amplifier from the calibration circuit.

During calibration of the negative voltage source, a ground voltage may be initially applied to the multi-stage amplifier. An offset voltage measurement (OVM) can be made at the output of the multi-stage amplifier which is a function of the offset voltages of the op amps in the multi-stage amplifier. The OVM can be recorded and subsequently used by the calibration circuit as the negative voltage source, in response to digital values, applies a range of negative voltages to the input of the multiple stage amplifier. The calibration circuit subtracts the OVM from measurements obtained at the output of the multi-stage amplifier to obtain corrected measurements, and uses the corrected measurements to calibrate the negative voltage source, e.g., by adjusting a relationship between the digital values and the output voltages. For example, the adjustment may reduce non-linear behavior and gain errors. The OVM is subtracted out in the calibration process to avoid an offset error of the multi-stage amplifier.

After the negative voltage source is calibrated, it is ready for the operational mode in which its output can be switched to an on-chip component such as a control line for a memory array, when a negative voltage is desired. The output of a positive voltage source can be switched to the on-chip component when a positive voltage is desired.

In one approach, the magnitude of an overall gain of the multi-stage amplifier is less than one. This allows the calibration circuit to measure the range of positive voltages which are output from the multi-stage amplifier (which correspond to the range of negative voltages which are output from the negative voltage source) with greater accuracy. Further, by correcting the measured voltages using the OVM when calibrating the negative voltage source, an accurate switchover between the negative voltage source and the positive voltage source can be achieved.

The positive voltage source can also be calibrated by the calibration circuit, without using the multi-stage amplifier.

These and other features are discussed further below.

FIG. 1 is a block diagram of an example storage device which includes a negative voltage source. The storage device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 could include one or more sets of blocks in respective planes, for example. See FIG. 2 and the example planes P0 and P1 which includes sets 205 and 215, respectively, of blocks B0-0 to B0-*n*-1 and B1-0 to B1-*n*-1, respectively. Each set has a number n blocks. Typically, each plane in the memory structure 126 is addressable by word lines via a row decoder 124 and by bit lines via a column decoder 132.

The read/write circuits 128 include multiple sense blocks 51, 52, . . . 53 (sensing circuitry) and allow a page of memory cells to be read or programmed in parallel. Typically, a controller 122 is included in the same storage device 100 (e.g., a removable storage card) as the one or more memory die 108. The controller may be off-chip, e.g., separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126 such as programming, reading and erasing. The control circuitry 110 includes a state machine 112, an on-chip address decoder 116 and a power control module 117 (power control circuit).

A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 116 provides an address interface between that used by the host or a memory controller to the hardware address used by the decoders 124 and 132.

The power control module 117 controls the power and voltages supplied to control lines such as word lines, select gate lines, bit lines and source lines during memory operations. It can include drivers or voltage sources for word lines, select gate, source (SGS) and select gate, drain (SGD) transistors and source lines. For example, the power control module 117 can include a positive voltage source 117*a*, a negative voltage source 117*b* and a multi-stage amplifier 117*c* which can provide a negative to positive voltage conversion for the negative voltage source. The positive voltage source may output a range of positive voltages extending from a ground voltage to a maximum positive voltage, and the negative voltage source may output a range of negative voltages extending from a ground voltage to a maximum negative voltage. See FIG. 9.

Multiple positive and negative voltage sources could be provided on the die.

During a calibration process for the positive voltage source, the positive voltage source may output a range of positive voltages to a calibration circuit 130 via a pin 119 and a path 125. During a calibration process for the negative voltage source, the negative voltage source may output a range of negative voltages to the multi-stage amplifier 117*c*, and in response, the multi-stage amplifier will output a range of positive voltages to the calibration circuit 130 via a pin 121 and a path 123. The calibration may occur at the time of manufacture of the memory device, for example. The range of negative voltages can be output sequentially, one voltage at a time, as different digital values are input to the negative voltage source. The digital values may be input by the calibration circuit to the negative voltage source via a path 135 and pin 136, or by the state machine 112 or controller 122, for example.

The calibration circuit 130 may include a processor 130*a* and a memory or storage location 130*b* to carry out a process for calibrating the voltage sources as described herein. The calibration circuit can be embodied in automatic test equipment (ATE) which is used in the electronic manufacturing industry to test electronic components and systems.

The calibration circuit can store a measurement of an offset voltage of the multi-stage amplifier when a ground voltage is applied by the negative voltage source, for instance, and subtract this measurement from positive voltages at the output node of the multi-stage amplifier when a range of negative voltages is applied to the input node of the multi-stage amplifier from the negative voltage source. This increases the accuracy of the calibration process.

Once the voltage sources are calibrated, they may provide voltages to the memory structure via the row decoder and path 127 and via the read/write circuits and path 133 during an operation involving the memory structure.

The control circuitry may communicate with the row decoder 124 via a path 131 such as to select a row for an operation, and with the column decoder 132 via a path 129 such as to select one or more bit lines for an operation.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 116 and 132, power control module 117, sense blocks 51, 52, . . . , 53, read/write circuits 128, controller 122, and so forth.

The off-chip controller 122 (which in one embodiment is an electrical circuit) may comprise a processor 122*c*, and memory such as ROM 122*a* and RAM 122*b*. The RAM 122*b* can be a DRAM, for instance. A copy of data to be programmed is received from the host and stored temporarily in the RAM until the programming is successfully completed to blocks in the memory device. The RAM may store one or more word lines of data.

An error-correction code (ECC) engine 122*e* can be used to correct a number of read errors. A memory interface 122*d*, in communication with ROM 122*a*, RAM 122*b* and processor 122*c*, is an electrical circuit that provides an electrical interface between the controller and one or more memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The memory in the controller 122, such as such as ROM 122*a* and RAM 122*b*, comprises code such as a set of instructions, and the processor is operable to execute the set of instructions to provide the functionality described herein. Alternatively or additionally, the processor can access code from a subset 126*a* of the memory structure 126, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or the subset 126*a* of the memory structure for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid-state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming, reading and erasing. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
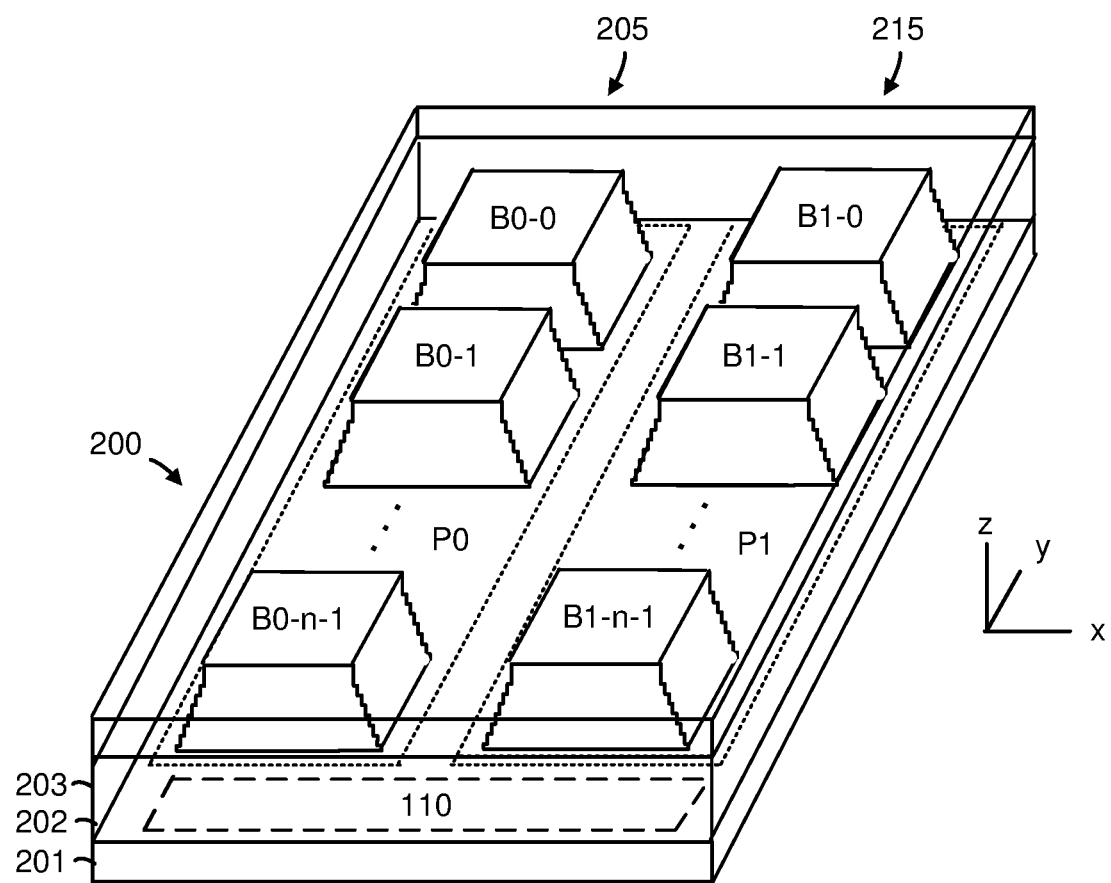
FIG. 2 is a perspective view of an example memory die 200 consistent with FIG. 1.

FIG. 2 is a perspective view of an example memory die 200 consistent with FIG. 1. Two sequences of blocks are provided in respective planes P0 and P1. The memory die includes a substrate 201, an intermediate region 202 in which blocks of memory cells are formed, and an upper region 203 in which one or more upper metal layers are patterned such as to form bit lines. Planes P0 and P1 represent respective isolated regions which are formed in the substrate 201. Further, a first set of blocks 205 comprising a number n blocks, labelled B0-0 to B0-$n$-1, are formed in P0, and a second set of blocks 215 comprising n blocks, labelled B1-0 to B1-$n$-1, are formed in P1. Each plane may have associated row and column control circuitry, such as the row decoder 124, read/write circuits 128 and column decoder 132 of FIG. 1. The control circuitry 110, which may be located in a peripheral area of the die, may be shared among the planes, in one approach. Each plane may have a separate set of bit lines.

The substrate 201 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible. As mentioned, parallel operations can be performed on one block in each plane.

While the above example is directed to a 3D memory device with vertically extending NAND strings, the techniques provided herein are also applicable to a 2D memory device in which the NAND strings extend horizontally on a substrate. The techniques are also applicable to semiconductor devices generally.

Figure 3:
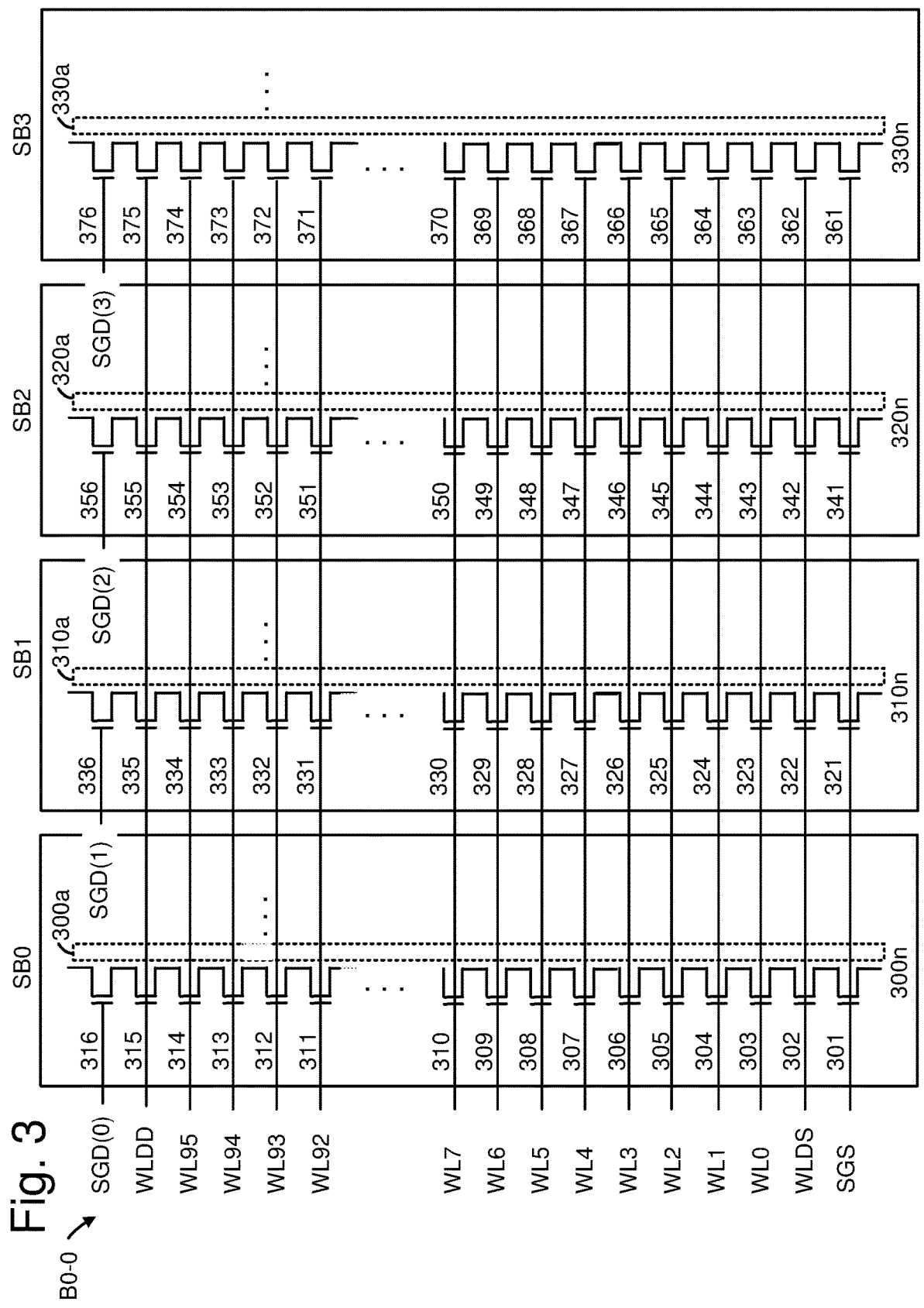
FIG. 3 depicts an example view of NAND strings in the block B0-0 of FIG. 2.

FIG. 3 depicts an example view of NAND strings in the block B0-0 of FIG. 2. The NAND strings are arranged in sub-blocks of the block in a 3D configuration. Each sub-block includes multiple NAND strings, where one example NAND string is depicted. For example, SB0, SB1, SB2 and SB3 comprise example NAND strings 300$n$, 310$n$, 320$n$ and 330$n$, respectively. The NAND strings have data word lines, dummy word lines and select gate lines. Each sub-block comprises a set of NAND strings which extend in the x direction and which have a common SGD line or control gate layer. The NAND strings 300$n$, 310$n$, 320$n$ and 330$n$ are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 300$n$, 310$n$, 320$n$ and 330$n$ have channels 300$a$, 310$a$, 320$a$ and 330$a$, respectively. Additionally, NAND string 300$n$ includes SGS transistor 301, dummy memory cell 302, data memory cells 303-314, dummy memory cell 315 and SGD transistor 316. NAND string 310$n$ includes SGS transistor 321, dummy memory cell 322, data memory cells 323-334, dummy memory cell 335 and SGD transistor 336. NAND string 320$n$ includes SGS transistor 341, dummy memory cell 342, data memory cells 343-354, dummy memory cell 355 and SGD transistor 356. NAND string 330$n$ includes SGS transistor 361, dummy memory cell 362, data memory cells 363-374, dummy memory cell 375 and SGD transistor 376.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 4:
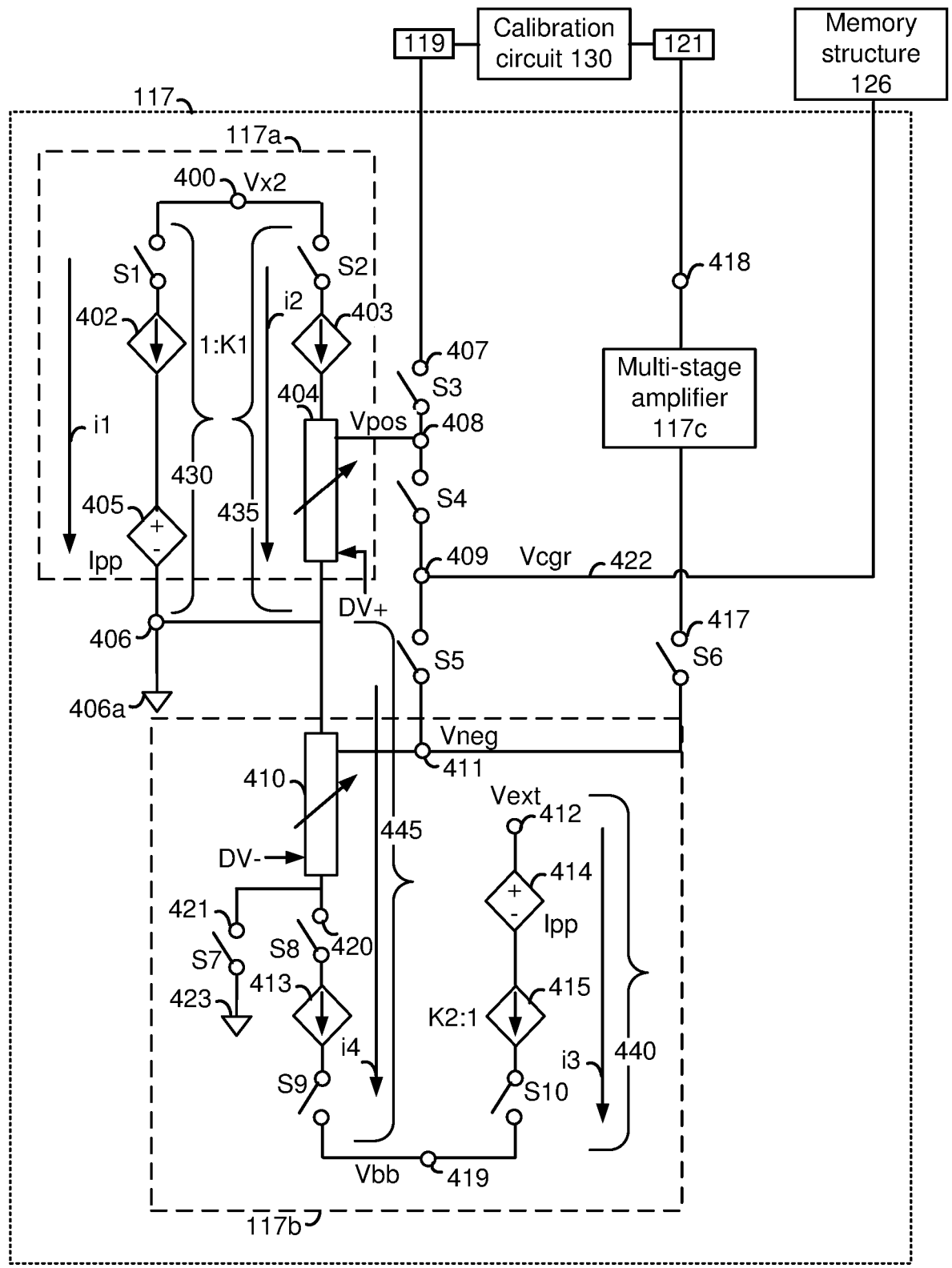
FIG. 4 depicts an example configuration of the power control module 117 of FIG. 1.

FIG. 4 depicts an example configuration of the power control module 117 of FIG. 1. The module includes the positive voltage source 117a and the negative voltage source 117b. The positive voltage source may be implemented as a current mirror. A first current i1 can be generated in a first current path 430 comprising a node 400, a switch S1, a current source 402, a voltage source 405 and a common ground node 406 connected to ground 406a. A positive voltage V×2 is applied to the node 400 and the switch S1 is closed (conductive) to generate a current in the first path. The first current i1 is mirrored (e.g., copied) in a ratio of 1:K1 to provide a second current i2 in a second current path 435 comprising the node 400, a switch S2, a current source 403, a first digital-to-analog converter (DAC) 404 and the common ground node 406 connected to ground. 1:K1 is the transfer ratio. The switch S2 is closed (conductive) to generate the second current in the second current path. The DAC receives digital values or code words DV+. In response to a digital value, a corresponding positive voltage Vpos is generated at a positive voltage output node 408. A calibrating process for the first DAC 404 involves obtaining a specified relationship between the digital values and the output voltages.

In a calibration process, Vpos can be output to the calibration circuit 130 by closing the switch S3 to connect node 407 with the positive voltage output node 408. In an operational mode, Vpos can be output to a common voltage output node 409 by closing the switch S4. The common voltage output node 409 in turn can be connected to a control line 422 for the memory structure 126, e.g., via the row decoder 124 or the column decoder 132 of FIG. 1. An example control gate read voltage, Vcgr, is provided on a control line such as a word line.

The negative voltage source may also be implemented as a current mirror. A third current can i3 be generated in a third current path 440 comprising a node 419, a switch S10, a current source 415, a voltage source 414 and a node 412 connected to a positive voltage Vext. A negative voltage Vbb is applied to the node 419 and the switch S10 is closed (conductive) to generate a current in the first path. The third current i3 is mirrored in a ratio of 1:K2 to provide a fourth current i4 in a fourth current path 445 comprising a node 419, a switch S9, a current source 413, a switch S8, a node 420, a second DAC 410 and the common ground node 406 connected to ground 406a. 1:K2 is the transfer ratio. The switches S9 and S8 are closed (conductive) to generate a current in the fourth current path. The DAC receives digital values or code words DV−. In response to a digital value, a corresponding negative voltage Vneg is generated at a negative voltage output node 411. See also FIG. 5B. A calibrating process for the second DAC 410 involves obtaining a specified relationship between the digital values and the output voltage. See FIGS. 7 and 8.

In a calibration process, Vneg can be output to the multi-stage amplifier 117c by closing the switch S6 to connect node 417 with the negative voltage output node 411. Node 417 is an input node and node 418 is an output node for the multi-stage amplifier. The output node is connected in turn to the calibration circuit 130. In an operational mode, Vneg can be output to the common voltage output node 409 by closing the switch S5. In one approach, Vpos or Vneg, but not both, is connected to the common voltage output node 409. The common voltage output node 409 is a common node since it is connected to the positive voltage output node 408 of the positive voltage source and its DAC 404, and to the negative voltage output node 411 of the negative voltage source and its DAC 410.

The second DAC 410 can alternatively be connected to a ground node 423 via a node 421 and a switch S7. For example, when a positive voltage is output to the positive voltage node 408 and the control line from the first DAC 404 of the positive voltage source, the second DAC can be grounded to the ground node 423 to prevent the any interference by the negative voltage source.

Connecting the the positive voltage source and the negative voltage source to the same physical node on the chip, e.g., the node 406, and grounding this node, ensures a smooth transition between negative and positive voltages at the 0 V crossover point. See FIG. 9. In contrast, if the positive voltage source and the negative voltage source were connected to separated ground paths, a discrepancy could result when the output crosses over the 0 V point, e.g., from positive to negative or from negative to positive.

Generally, the circuit of FIG. 4 extends the driven voltage range of a semiconductor device to include both positive and negative voltages. The circuit avoids introducing calibration and consistency requirements between the different voltage domains (the positive and negative domains). The 0 V point which is crosses is the true 0 V point and not a virtual ground. As a result, there are no dead zones between two reference domains for the DACs, where a change in the input digital value to a DAC does not result in a change of output voltage. The circuit provides a unified approach to voltage generation. Other benefits include relaxing the design requirements for resistive DACs, reducing the area of the circuit, improving the speed, reducing the noise sensitivity, simplifying the calibration method, and removing a requirement for a separate off-chip calibration on the negative reference generation.

Moreover, by combining the positive and negative voltage sources in a common circuit as depicted, the currents travel through similar process corners. That is, the effects of process, voltage and temperature (PVT) variations in the fabrication process are uniform in the circuit. The different process corners refer to carrier mobilities in n-FET and p-FET transistors of the circuit. The process corners can include typical-typical (TT), fast-fast (FF), slow-slow (SS), fast-slow (FS), and slow-fast (SF). Since the positive and negative reference currents are from a common circuit branch, there is a greater correlation between the positive and negative voltages and an accurate transition at the 0 V crossover point. Tests have shown that the circuit provides low power consumption especially with the negative power source, low power consumption of the positive voltage V×2, fast settling behavior and good isolation between the positive and negative power sources.

In FIG. 4, a positive voltage source (117a) comprising a first current path (430) is configured to copy a first current (i1) to a second current (i2) in a second current path (435). A negative voltage source (117b) comprising a third current path (440) is configured to copy a third current (i3) to a fourth current (i4) in a fourth current path (445). A common ground node (406) is connected to the first current path, the second current path and the fourth current path.

The circuit also includes a common voltage output node (409) connected to a control line (422) of a memory structure. The common voltage output node is connected by a first switch (S4) to a positive voltage output node (408) of the positive voltage source and by a second switch (S5) to a negative voltage output node (411) of the negative voltage source.

A third switch (S7) is configured to connect the second DAC to ground, and a controller is configured to close the third switch while providing a first digital value (DV+) to the first DAC to provide a positive voltage at the common voltage output node.

The controller may be also configured to close the first switch and open the second switch while providing the first digital value to the first DAC.

The controller may be also configured to open the third switch while providing a second digital value (DV−) to the second DAC to provide a negative voltage at the common voltage output node.

The controller may be also configured to open the first switch and close the second switch while providing the second digital value to the second DAC.

The controller may be also configured to provide a range of digital values to the positive voltage source to provide a range of positive voltages at the common voltage output node (409) while closing the first switch and opening the second switch, and at another time, provide a range of digital values to the negative voltage source to provide a range of negative voltages at the common voltage output node (409) while opening the first switch and closing the second switch.

The controller may be also configured to close the first switch and open the second switch to transition from applying a negative voltage to the common voltage output node from the negative voltage source to applying a positive voltage to the common voltage output node from the positive voltage source, and close the second switch and open the first switch to transition from applying a positive voltage to the common voltage output node from the positive voltage source to applying a negative voltage to the common voltage output node from the negative voltage source.

In the circuit of FIG. 4, the first current and the second current are sunk at the common ground node, and the fourth current is sourced at the common ground node.

The second current path extends between a node (400) configured to receive a positive voltage and the common ground node, and the fourth current path extends between a node (419) configured to receive a negative voltage and the common ground node.

FIG. 5A depicts an example configuration of the multi-stage amplifier 117c of FIGS. 1 and 4. An input voltage Y is received at the input node 417 and an output voltage X is provided at the output node 418. The multi-stage amplifier includes a first stage, Stage 1, a second stage, Stage 2, and a third stage, Stage 3. Switches S21-S25 are depicted being controlled by a control signal phi or the inverse signal ~phi. S21, S23 and S25 are closed (conductive) when phi is high, and open (non-conductive) when phi is low. Switches S22 and S24 are closed when phi is low and open when phi is high. S22 connects the node 501 to a node 502, which grounded. S24 connects a node 505 to the node 507.

Stage 1 includes a first op amp (OA1) which has an inverting input node 503, a non-inverting input node 504 and an output node 507. Node 504 may be grounded. A feedback path 520 connects the output node 507 to the input node 503 via the switch S23. A first capacitor C1 is connected between the nodes 501 and 503. A second capacitor C2 has a first side 521 connected to the feedback path 520 and an opposing second side 522 connected to ground via the switch S25 and a node 506, or to the feedback path via a switch S24. Stage 1 has a gain which is the ratio of the voltage at node 507, VN507, to the voltage at node 503, VN503. The gain may be a positive gain, such as a gain of less than one, when a negative voltage is applied to the node 503. For instance, a gain of 0.5 may be obtained by setting the capacitance of the capacitors C2/C1 in the ratio of 0.5:1. C2 helps sample and store the offset charge for OA1 and generate a gain or attenuation for the other stages.

In a calibration process consistent with FIG. 6A, the input node 417 may initially receive a ground voltage from the negative voltage supply. S21 is closed and the voltage passes to a node 501 and through a capacitor C1 with a very low capacitance, such as 250 femtofarad. C1 helps isolate the node 503 so that the multi-stage amplifier does not interfere with the voltage at the node 417. With S23 closed, the feedback path 520 is completed so that VN507 is fed back to VN503.

Each op amp in the multi-stage amplifier may have an offset voltage. The offset voltage is the differential voltage between the two inputs of the op amp when the op amp is in a steady state. The offset is caused by factors such as a mismatch between transistors and other components of the op amp. For example, OA1 may have a small input offset voltage such as +/−5-20 mV. VN507 thus represent the offset voltage of OA1, which is passed to Stage 2.

OA1 has a positive power supply of Avdd such as 2 to 4 V and a negative power supply of Vbb such as −4 to −3 V.

Stage 2 includes a second op amp (OA2). The gain for OA2 can be positive or negative depending on the voltage at the input node 508 and the level of Vref OA2 has an inverting input node 508 and a non-inverting input node 509, which receives a positive voltage Vref. A resistor R1 is connected between the nodes 507 and 508, while a resistor R2 is connected in a feedback path 514 between the output node 513 and the input node 508. The gain of OA2 is VN513/VN508, where VN513=Vref+(Vref−VN508)×R2/R1. If we assume R1=R2, VN513=2×Vref−VN508 and the gain of Stage 2 is VN513/VN508 or (2×Vref−VN508)/VN508.

With Vref=0 V, VN513=−VN508 since the gain is −1. If VN508 is a positive voltage such as 20 mV, such as might occur when 0 V is input to node 417, the output VN513=−20 mV. However, to avoid VN513 being negative, resulting in the calibration circuit having to measure a negative voltage, Vref can be set to a positive voltage which satisfies the condition: VN513>0 or Vref+(Vref−VN508)×R2/R1>0, or with R1=R2, 2×Vref−VN508>0 or Vref>VN508/2. The positive reference voltage Vref can therefore be at least twice the offset voltage of the first op amp, OA1. Vref can be set to a positive voltage which is sufficiently high to provide the output of OA2, VN513, as a positive voltage. For example, if VN508=+0.02 V, Vref>0.01 V based on Vref>VN508/2. Vref>0.01 V is an example of Vref being greater than a specified voltage.

If VN508 is a negative voltage such as −2 V, the output VN513=2×0.4−(−2)=2.8 V with Vref=0.4 V. Thus, the gain is negative and the negative voltage is transformed to a positive voltage.

In practice, a value such as Vref=0.4 V can be used. For example, if VN508=+0.02 V, VN513=2×0.4−0.02=0.78 V. VN508 is thus increased, or offset higher, to a higher voltage based on the reference voltage Vref applied at the non-inverting input node of OA2. This higher, positive value of VN508 can be more easily measured by the calibration circuit.

OA2 may therefore operate with a positive gain when VN508 is a positive voltage less than a specified voltage such as 2×Vref, or with a negative gain when VN508 is a positive voltage greater than 2×Vref or when VN508 is a negative voltage. Generally, the second op amp has a negative gain when a negative voltage is applied to the inverting input node of the second op amp and when a positive voltage greater than a specified voltage is applied to the inverting input node of the second op amp, and a positive gain when a positive voltage less than the specified voltage is applied to the inverting input node of the second op amp.

Vref is tunable and depends on factors such as Avdd and the output voltage range of the second stage. The level of Vref impacts the design of the third stage op amp.

OA2 has a positive power supply of Avdd and a negative power supply of Vbb.

Stage 3 includes a third op amp (OA3) which may be configured as a voltage follower having a gain of 1 (unity gain), for example. OA3 helps isolate the multi-stage amplifier from the calibration circuit. OA3 has a non-inverting input node 510, an inverting input node 511 and an output node 418. A feedback path 512 connects the output node to the inventing input node 511. In addition to the offset voltage of OA1, offset voltages of OA2 and OA3 could potentially affect the voltage obtained at the output node 418. The same offset voltages will be present when a range of negative voltages are input to the node 417 in the calibration process.

OA3 has a positive power supply of Avdd and a negative power supply at ground. AVdd and Vbb can be tuned to optimize the performance of the multi-stage amplifier.

Subsequently, in a second part of the calibration process, a range of negative voltages are input to node 417 by the negative voltage source.

The multi-stage amplifier has an overall gain of G=G1×G2×G3, where G1, G2 and G3 are the gains of the first, second and third stages, respectively. The gain of Stage 1 is VN507/VN503, which may be 0.5, for example. The gain of Stage 2 may be (2×Vref−VN508)/VN508, where VN508=0.5×VN503. The gain of Stage 3 may be 1.

In another approach, if Vref=0 V, G2=−1, and the overall gain is 0.5×(−1)×1=−0.5.

Figure 5B:
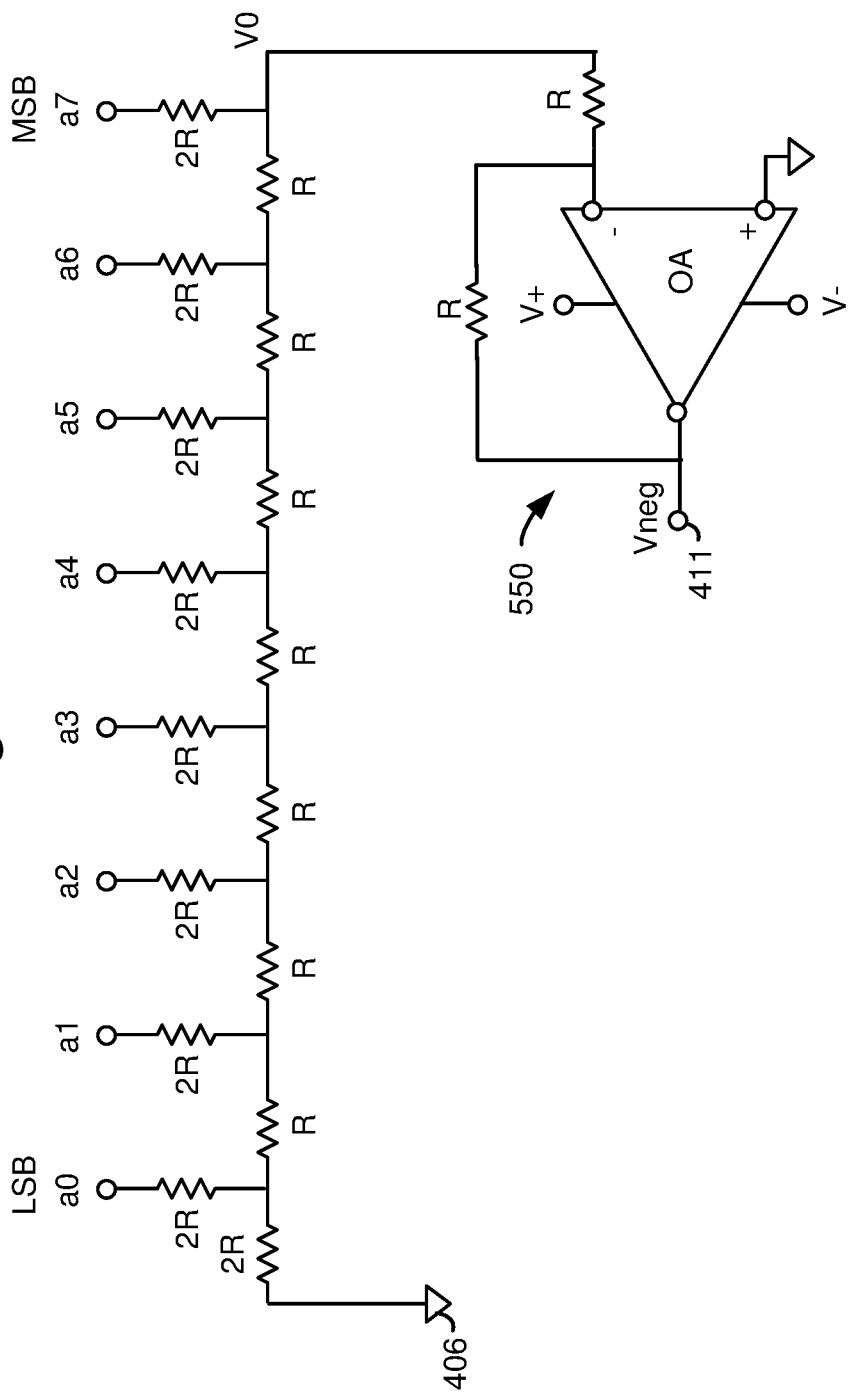
FIG. 5B depicts an example configuration of the digital-to-analog converter 410 of the negative voltage source 117b of FIG. 4.

FIG. 5B depicts an example configuration of the digital-to-analog converter 410 of the negative voltage source 117b of FIG. 4. The DAC is in the form of an eight-bit R-2R resistor ladder network. The DAC can be implemented in various ways. In this example, an R-2R ladder uses a repetitive arrangement of resistors connected to the grounded node 406 of FIG. 4. A digital value having eight bits is used to control the voltage output. The eight bits range from a0, a least significant bit (LSB), to a7, a most significant bit (MSB). The bit values may be provided by digital logic gates. The inputs may be switched between V=0 (logic 0) and V=3 V, for instance (logic 1). The voltage V0 is a function of the bits and their weighted contributions according to V1=3 V×DV÷2ΛN. DV is the value of an eight bit digital value or code word and N is the number of bits in the digital value. With N=8, 2ΛN=256 and V1=3 V×DV/256. If DV=00000000 (binary) or 0 (decimal), V0=0 V. If DV=11111111 (binary) or 256 (decimal), V0=3 V.

A unity gain inverter circuit 550, similar to OA2 in FIG. 5A may transform V0 to a negative value of Vneg, in one possible approach, where Vneg=−VO.

Note that a DAC is one example of a voltage source. Another example is a charge pump. A charge pump can be calibrated in a similar manner as calibrating a DAC by adjusting the relationship between output voltages and digital values input to the charge pump.

The DACs in FIGS. 5A and 5B are both shown as being eight-bit DACs but a different number of bits can be used for the different DACs. Additionally, the DACs are shown as being resistive DACs but capacitive DACs could also be used.

The currents i1 and i3 can be generated by band gap reference circuits which are temperature-insensitive.

Figure 5C:
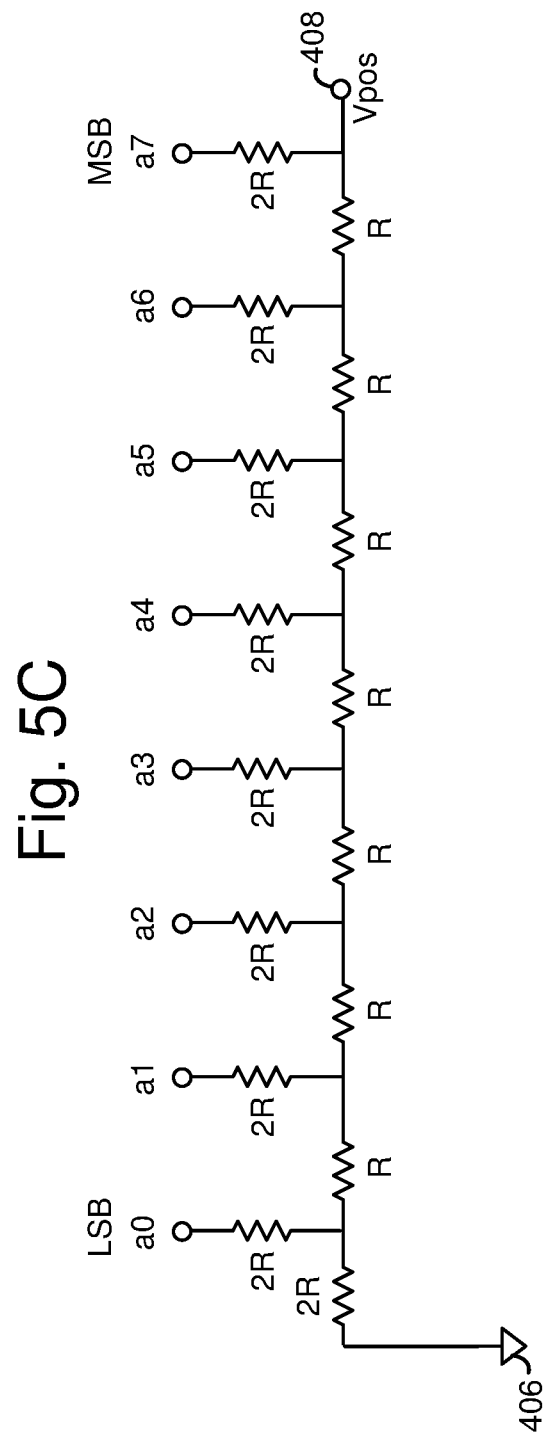
FIG. 5C depicts an example configuration of the digital-to-analog converter 404 of the positive voltage source 117a of FIG. 4.

FIG. 5C depicts an example configuration of the digital-to-analog converter 404 of the positive voltage source 117a of FIG. 4. The DAC is in the form of an eight-bit R-2R resistor ladder network. This implementation of the DAC is similar to FIG. 5A. An R-2R ladder uses a repetitive arrangement of resistors connected to the grounded node 406 of FIG. 4. A digital value having eight bits is used to control the voltage output. The eight bits range from a0, a least significant bit (LSB), to a7, a most significant bit (MSB). The voltage Vpos is a function of the bits and their weighted contributions according to V1=3 V×DV/2ΛN. DV is the value of an eight bit digital value or code word and N is the number of bits in the digital value. With N=8, 2ΛN=256 and V1=3 V×DV÷256. If DV=00000000 (binary) or 0 (decimal), Vpos=0 V. If DV=11111111 (binary) or 256 (decimal), Vpos=3 V. Since this DAC is for a positive voltage source, the unity gain inverter circuit of FIG. 5B is omitted.

FIG. 6A depicts an example process for calibrating the negative voltage source 117b of FIGS. 1 and 4. The process can include two parts. The first part is an initialization and offset recording phase. Step 600 includes applying a ground voltage (0 V), such as from a negative voltage source, to an inverting input node of a first op amp in a multi-stage amplifier. Step 600 is characterized by blocks 600a-600c. Block 600a indicates the first op amp has a positive gain when a negative voltage is applied to the inverting input node of the first op amp. Block 600b indicates the multi-stage amplifier comprises a second op amp having a negative gain when a negative voltage is applied to an inverting input node of the second op amp. Block 600c indicates the multi-stage amplifier comprises a third op amp configured as a voltage follower, wherein the second op amp is after the first op amp and the third op amp is after the second op amp.

Step 601 includes recording an offset voltage measurement (OVM) at an output node of the third op amp. OVM can be positive or negative. A second part includes a monitoring phase. Step 602 includes connecting a negative voltage source to the inverting input node of the first op amp, the negative voltage source outputting a range of negative voltages based on a set of digital values. For example, the digital values DV− in FIG. 4 can be input to the second DAC 410. The digital values may be input in succession, one at a time, to cause the negative voltage source to apply a range of negative voltages in succession to the inverting input node of the first op amp.

Step 603 includes obtaining voltage measurements at the output node of the third op amp. Step 604 includes obtaining corrected measurements by subtracting the OVM from the measurements obtained at the output node of the third op amp when the range of negative voltages is output to the inverting input node of the first op amp.

Step 605 includes calibrating the negative voltage source based on the corrected measurements. For example, see FIGS. 7 and 8. Steps 601, 603-605 can be performed by the calibration circuit, for instance. Steps 600 and 602 can involve the calibration circuit or other controller inputting digital values to the negative voltage source.

The process provides a number of advantages. For example, the techniques help extend the driven voltage range to include both positive and negative voltage. This is particularly helpful in control systems for solid state memory devices. The techniques accurately measure a range of the negative voltages and convert them to positive voltages in a calibration process for a negative voltage source. The techniques simplify and facilitate ATE measurements. The techniques automatically remove an offset error voltage which is present in a negative to positive voltage conversion process.

Figure 6B:
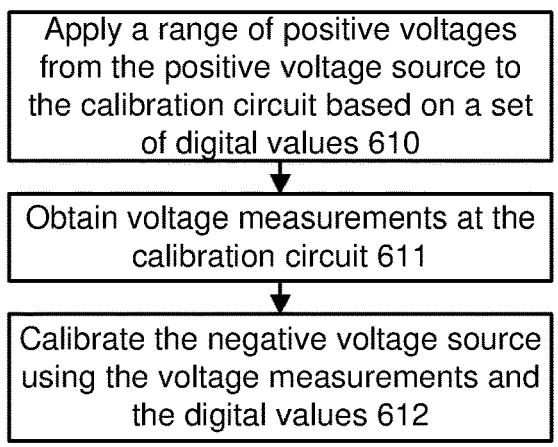
FIG. 6B depicts an example process for calibrating the positive voltage source 117a of FIGS. 1 and 4.

FIG. 6B depicts an example process for calibrating the positive voltage source 117a of FIGS. 1 and 4. Step 610 includes applying a range of positive voltages from the positive voltage source at the input to the calibration circuit based on a set of digital values. For example, the digital values DV+ in FIG. 4 can be input to the first DAC 404. The positive voltage can bypass the multi-stage amplifier since there is no need for a negative to positive voltage conversion. Step 611 includes obtaining voltage measurements at the calibration circuit. Step 612 includes calibrating the positive voltage source using the voltage measurements and the digital values.

Figure 6C:
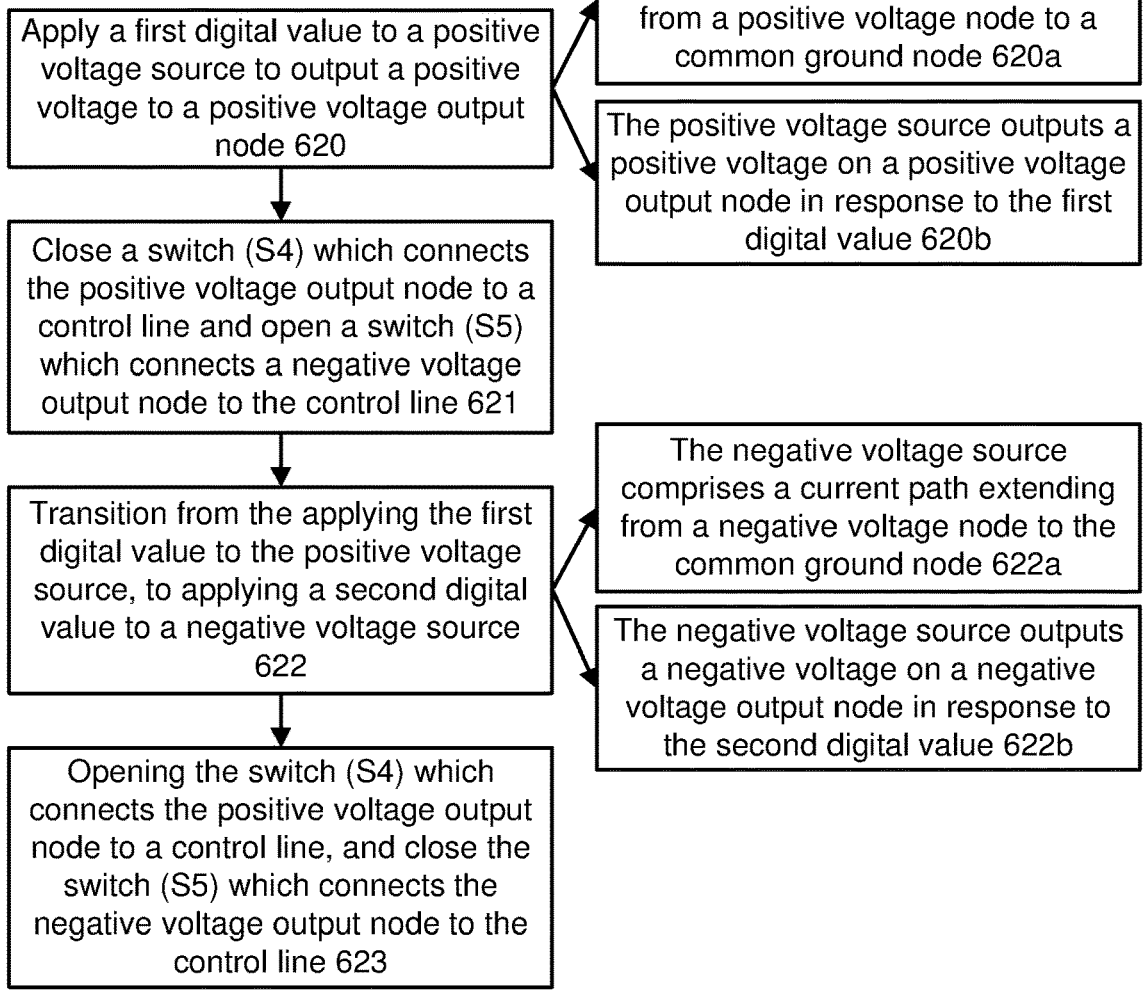
FIG. 6C depicts an example process for transitioning from applying a positive voltage from the positive voltage source 117a of FIG. 4, to applying a negative voltage from the negative voltage source 117b of FIG. 4.

FIG. 6C depicts an example process for transitioning from applying a positive voltage from the positive voltage source 117a of FIG. 4, to applying a negative voltage from the negative voltage source 117b of FIG. 4. The process can be modified to depict transitioning from applying a negative voltage from the negative voltage source 117b of FIG. 4, to applying a positive voltage from the positive voltage source 117a of FIG. 4 by starting the process at steps 622 and 623 and then proceeding to steps 620 and 621.

Step 620 includes apply a first digital value (DV+) to a positive voltage source to output a positive voltage to a positive voltage output node 408. Step 620 is characterized by blocks 620a and 620b. Block 620a indicates the positive voltage source comprises a current path extending from a positive voltage node to a common ground node. Block 620b indicates the positive voltage source outputs a positive voltage on a positive voltage output node in response to the first digital value. Step 621 includes closing (making conductive) a switch (S4) which connects the positive voltage output node to a control line, and opening (making non-conductive) a switch (S5) which connects a negative voltage output node to the control line 422. Steps 620 and 621 can be performed concurrently.

Step 622 includes transitioning from the applying the first digital value to the positive voltage source, to applying a second digital value to a negative voltage source. Step 622 is characterized by blocks 622a and 622b. Block 622a indicates the negative voltage source comprises a current path extending from a negative voltage node to the common ground node. Block 622b indicates the negative voltage source outputs a negative voltage on a negative voltage output node in response to the second digital value. Step 623 includes opening the switch (S4) which connects the positive voltage output node to a control line, and closing the switch (S5) which connects the negative voltage output node to the control line 623. Steps 622 and 623 can be performed concurrently, and separately from steps 620 and 621.

A related method includes applying a first digital value to a positive voltage source (117a), the positive voltage source comprising a current path (435) extending from a positive voltage node (400) to a common ground node (406), the positive voltage source outputting a positive voltage on a positive voltage output node (408) in response to the first digital value; and transitioning from the applying the first digital value to the positive voltage source, to applying a second digital value to a negative voltage source (117b), the negative voltage source comprising a current path (445) extending from a negative voltage node (419) to the common ground node (406), the negative voltage source outputting a negative voltage on a negative voltage output node (411) in response to the second digital value, the transitioning comprising opening a switch (S4) which connects the positive voltage output node to a control line (422), and closing a switch (S5) which connects the negative voltage output node to the control line.

The method can include, during the applying the first digital value to the positive voltage source, closing a switch (S4) which connects the positive voltage output node to the control line and opening a switch (S5) which connects the negative voltage output node to the control line.

The method can also include, during the applying the second digital value to the positive voltage source, closing the switch (S5) which connects the negative voltage output node to the control line and opening the switch (S4) which connects the positive voltage output node to the control line.

The current path of the negative voltage source can comprise a digital-to-analog converter (410), in which case the method can further include grounding the digital-to-analog converter during the applying of the first digital value to the positive voltage source.

A related apparatus includes: a path (435) which extends from a node (400) configured to receive a positive voltage to a common ground node, and which comprises a first digital-to-analog converter configured to output a positive voltage; a path (445) which extends from a node (419) configured to receive a negative voltage to the common ground node, and which comprises a second digital-to-analog converter configured to output a negative voltage; and means for alternately connecting the first digital-to-analog converter and the second digital-to-analog converter to a control line.

The means for alternately connecting can comprise a switch (S4) connecting a positive voltage output node of the first digital-to-analog converter to the control line, and a switch (S5) connecting a negative voltage output node of the second digital-to-analog converter to the control line.

The path (435) which extends from the node (400) configured to receive the positive voltage to the common ground node can be arranged in a current mirror with a parallel path (430) which extends from the node (400) configured to receive the positive voltage to the common ground node.

The path (445) which extends from the node (419) configured to receive the negative voltage to the common ground node can be arranged in a current mirror with a parallel path (440) which extends from the node (419) configured to receive the negative voltage to another node (412) configured to receive a positive voltage.

The apparatus can further include means for grounding the second digital-to-analog converter when the first digital-to-analog converter is connected to the control line. The means for grounding can include the node 421, the switch S7 and the ground node 423.

FIG. 7 depicts an example plot of a voltage magnitude versus a digital value for a voltage source, showing different types of errors. Generally, a voltage source can have different types of errors which can be corrected in a calibration process. In this example, an ideal voltage output or gain characteristic is represented by a plot 700. A 0 V output is provided at the lowest digital value and the output increases in a linear way to a desired maximum output at the highest digital value. A plot 703 represents a nonlinear error. A plot 702 represents a gain error, where the slope of the plot 702 is different than the slope of the plot 700. A plot 701 represents an offset error, where the level of the plot is offset from the level of the plot 700.

FIG. 8 depicts an example plot of a voltage magnitude versus a digital value for the negative voltage source 117b of FIGS. 1 and 4, in an example process for calibrating the negative voltage source which is consistent with step 612 of FIG. 6B. A plot 800 represents the desired gain characteristic of the negative voltage source, without the multi-stage amplifier. A plot 807 represents the actual gain characteristic of the negative voltage source, without the multi-stage amplifier. The plot 801 represents the desired gain characteristic of the negative voltage source without the multi-stage amplifier. The voltages of plot 801 are obtained by multiplying the voltages of plot 700 by G, the overall gain of the multi-stage amplifier, and subtracting OVM. In this example, G<1 but other options include G=1 and G>1. The desired gain without the multi-stage amplifier (plot 800) is thus translated to a desired gain with the multi-stage amplifier and OVM correction (plot 801). A plot 802 represents an error which includes a nonlinear error and a gain error, as an example.

For digital values in the range represented by the arrow 830, the gain is lower than ideal. For digital values in the range represented by the arrow 831, the gain is higher than ideal. Accordingly the calibration process can modify the digital values to achieve the desired gain. For example, the digital value DV1, when input to the negative voltage source, results in the non-ideal output voltage (V1×G)−OVM of the multi-stage amplifier at point 803 in plot 802. However, in the ideal gain characteristic, the digital value DV2 results in (V1×G)−OVM (point 804 in plot 801) being output from the multi-stage amplifier. The points 803 and 804 correspond to the points 805 and 806, respectively, in the plots 807 and 800, respectively. The calibration process can define a relationship between digital values and output voltages over a range of output voltages which results in the ideal gain characteristic. With this relationship defined, a controller can input a known digital value to the negative voltage source to obtain a known output voltage. The controller could maintain a table which cross references digital values to output voltages.

Advantageously, the negative voltage source can be calibrated by the calibration circuit using positive output voltages.

Figure 9:
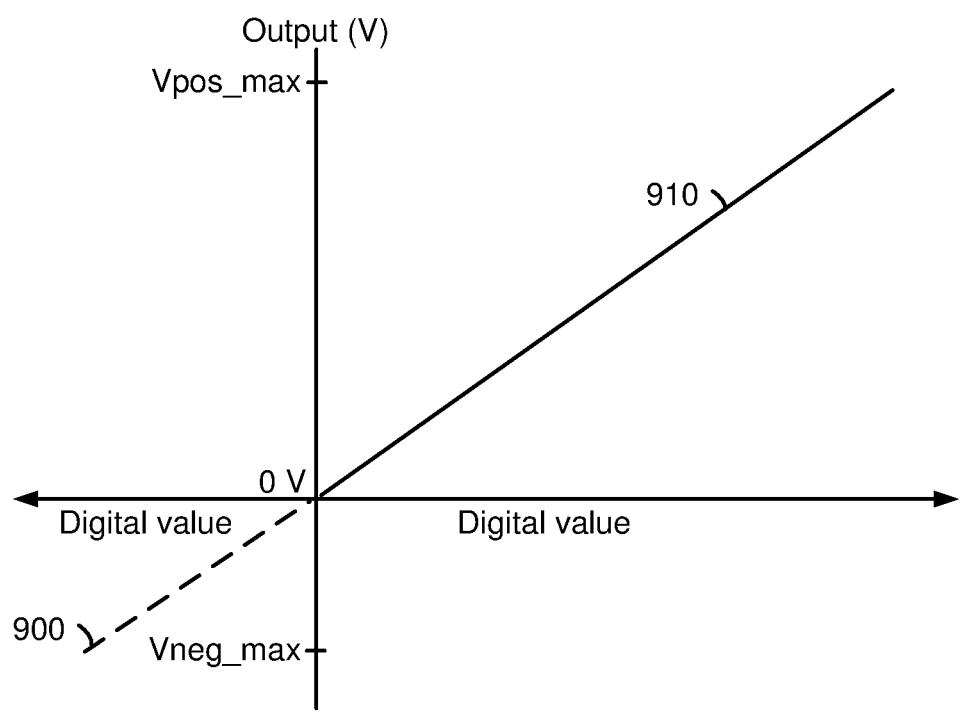
FIG. 9 depicts an example plot of output voltage versus digital values for the positive voltage source 117a and the negative voltage source 117b of FIGS. 1 and 5A.

FIG. 9 depicts an example plot of output voltage versus digital values for the positive voltage source 117a and the negative voltage source 117b of FIGS. 1 and 5A. A dashed line plot 900 represents a voltage output, Vneg, of the negative voltage source, and a solid line plot 910 represents a voltage output, Vpos, of the positive voltage source. Vneg ranges from Vneg_max to 0 V, and Vpos ranges from 0 V to Vpos_max. A linear gain characteristic can be obtained with a smooth crossover at the 0 V point.

Accordingly, it can be seen that, in one implementation, an apparatus comprises: a first stage in a multi-stage amplifier, the first stage comprising a first operational amplifier having a positive gain when a negative voltage is applied to an inverting input node of the first operational amplifier, the first stage comprising a first capacitor connecting an input node of the multi-stage amplifier to the inverting input node of the first operational amplifier, a feedback path connecting the inverting input node of the first operational amplifier to an output node of the first operational amplifier, and a second capacitor comprising a first side connected to the inverting input node of the first operational amplifier and a second side connected to ground; and a second stage of the multi-stage amplifier, the second stage comprising a second operational amplifier having an inverting input node connected to the output node of the first operational amplifier, and a non-inverting input node connected to a positive reference voltage, the second operational amplifier having a negative gain when a negative voltage is applied to the inverting input node of the second operational amplifier and when a positive voltage greater than a specified voltage is applied to the inverting input node of the second operational amplifier, and a positive gain when a positive voltage less than the specified voltage is applied to the inverting input node of the second operational amplifier.

In another implementation, a method comprises: applying a ground voltage to an inverting input node of a first operational amplifier in a multi-stage amplifier, the first operational amplifier having a positive gain when a negative voltage is applied to the inverting input node of the first operational amplifier, the multi-stage amplifier comprising a second operational amplifier having a negative gain when a negative voltage is applied to an inverting input node of the second operational amplifier, and the multi-stage amplifier comprising a third operational amplifier configured as a voltage follower, wherein the second operational amplifier is after the first operational amplifier and the third operational amplifier is after the second operational amplifier; recording an offset voltage measurement at an output node of the third operational amplifier; connecting a negative voltage source to the inverting input node of the first operational amplifier, the negative voltage source outputting a range of negative voltages; obtaining corrected measurements by subtracting the offset voltage measurement from measurements obtained at the output node of the third operational amplifier when the range of negative voltages is output to the inverting input node of the first operational amplifier; and calibrating the negative voltage source based on the corrected measurements.

In another implementation, an apparatus comprises: a negative voltage source configured to generate a ground voltage and a range of negative voltages in response to digital values input to the negative voltage source; a multi-stage amplifier comprising a first stage having a positive gain when a negative voltage is applied to the first stage and a second stage having a negative gain when a negative voltage is applied to the second stage and a positive gain when a positive voltage less than a specified voltage is applied to the second stage, the multi-stage amplifier is configured to translate the ground voltage to an offset voltage measurement, and to translate the range of negative voltages to a range of positive voltages; means for storing the offset voltage measurement; and means for obtaining corrected measurements by subtracting the offset voltage measurement from voltages in the range of positive voltages.

The means for storing the offset voltage measurement described above can include the storage location 130b of the calibration circuit 130, for example. The means for obtaining corrected measurements described above can include the components of the memory device 100 of FIG. 1, such as the calibration circuit 130 and its processor 130a, the controller 122 and the control circuitry 110.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a first stage in a multi-stage amplifier, the first stage comprising a first operational amplifier having a positive gain when a negative voltage is applied to an inverting input node of the first operational amplifier, the first stage comprising a first capacitor connecting an input node of the multi-stage amplifier to the inverting input node of the first operational amplifier, a feedback path connecting the inverting input node of the first operational amplifier to an output node of the first operational amplifier, and a second capacitor comprising a first side connected to the inverting input node of the first operational amplifier and a second side connected to ground; and
a second stage of the multi-stage amplifier, the second stage comprising a second operational amplifier having an inverting input node connected to the output node of the first operational amplifier, and a non-inverting input node connected to a positive reference voltage, the second operational amplifier having a negative gain when a negative voltage is applied to the inverting input node of the second operational amplifier and when a positive voltage greater than a specified voltage is applied to the inverting input node of the second operational amplifier, and a positive gain when a positive voltage less than the specified voltage is applied to the inverting input node of the second operational amplifier.

2. The apparatus of claim 1, further comprising:
a third stage of the multi-stage amplifier, the third stage comprising a third operational amplifier configured as a voltage follower, wherein a non-inverting input node of the third operational amplifier is connected to an output node of the second operational amplifier.

3. The apparatus of claim 1, wherein:
the positive gain of the first operational amplifier when a negative voltage is applied to the inverting input node of the first operational amplifier is less than one; and
the first stage and the second stage are configured to translate a range of negative voltages at the inverting input node of the first operational amplifier to a range of positive voltages at an output node of the second operational amplifier, the range of positive voltages is less than the range of negative voltages.

4. The apparatus of claim 1, wherein:
the positive gain of the first operational amplifier when a negative voltage is applied to the inverting input node of the first operational amplifier is a function of a ratio of a capacitance of the second capacitor to a capacitance of the first capacitor.

5. The apparatus of claim 4, wherein:
the capacitance of the second capacitor is less than the capacitance of the first capacitor.

6. The apparatus of claim 1, further comprising:
a first switch configured to connect the second side of the first capacitor to the output node of the first operational amplifier; and
a second switch configured to connect the second side of the second capacitor to ground, wherein based on a control signal, the first switch is non-conductive when the second switch is conductive.

7. The apparatus of claim 6, further comprising:
a third switch in the feedback path, wherein based on the control signal, the third switch is conductive when the second switch is conductive.

8. The apparatus of claim 1, wherein:
the positive reference voltage is at least twice an offset voltage of the first operational amplifier.

9. A method, comprising:
applying a ground voltage to an inverting input node of a first operational amplifier in a multi-stage amplifier, the first operational amplifier having a positive gain when a negative voltage is applied to the inverting input node of the first operational amplifier, the multi-stage amplifier comprising a second operational amplifier having a negative gain when a negative voltage is applied to an inverting input node of the second operational amplifier, and the multi-stage amplifier comprising a third operational amplifier configured as a voltage follower, wherein the second operational amplifier is after the first operational amplifier and the third operational amplifier is after the second operational amplifier;
recording an offset voltage measurement at an output node of the third operational amplifier;
connecting a negative voltage source to the inverting input node of the first operational amplifier, the negative voltage source outputting a range of negative voltages;
obtaining corrected measurements by subtracting the offset voltage measurement from measurements obtained at the output node of the third operational amplifier when the range of negative voltages is output to the inverting input node of the first operational amplifier; and
calibrating the negative voltage source based on the corrected measurements.

10. The method of claim 9, wherein:
the second operational amplifier has a negative gain when a positive voltage greater than a specified voltage is applied to the inverting input node of the second operational amplifier.

11. The method of claim 10, wherein:
the second operational amplifier has a positive gain when a positive voltage less than the specified voltage is applied to the inverting input node of the second operational amplifier.

12. The method of claim 9, wherein:
the ground voltage is applied by the negative voltage source.

13. The method of claim 9, wherein:
a first capacitor is connected in series between an input node of the multi-stage amplifier and the inverting input node of the first operational amplifier;
a feedback path connects an output node of the first operational amplifier to the inverting input node of the first operational amplifier; and
a second capacitor is connected to the feedback path; and
the positive gain of the first operational amplifier when a negative voltage is applied to the inverting input node of the first operational amplifier is a function of a ratio of a capacitance of the second capacitor to a capacitance of the first capacitor.

14. The method of claim 9, wherein:
the positive gain of the first operational amplifier when a negative voltage is applied to the inverting input node of the first operational amplifier is less than one; and
a range of the measurements obtained at the output node of the third operational amplifier is less than the range of the negative voltages output to the inverting input node of the first operational amplifier.

15. The method of claim 9, wherein:
the multi-stage amplifier is on a memory die;
the obtaining the corrected measurements is performed by test equipment which is external to the memory die; and
the negative voltage source is a digital-to-analog converter on the memory die.

16. An apparatus, comprising:
a negative voltage source configured to generate a ground voltage and a range of negative voltages in response to digital values input to the negative voltage source;
a multi-stage amplifier comprising a first stage having a positive gain when a negative voltage is applied to the first stage and a second stage having a negative gain when a negative voltage is applied to the second stage and a positive gain when a positive voltage less than a specified voltage is applied to the second stage, the multi-stage amplifier is configured to translate the ground voltage to an offset voltage measurement, and to translate the range of negative voltages to a range of positive voltages;
means for storing the offset voltage measurement; and
means for obtaining corrected measurements by subtracting the offset voltage measurement from voltages in the range of positive voltages.

17. The apparatus of claim 16, wherein:
the second stage has a negative gain when a positive voltage greater than the specified voltage is applied to the second stage.

18. The apparatus of claim 16, wherein:
the negative voltage source is on a chip;
a first switch is configured to connect an output node of the negative voltage source to an input node of the multi-stage amplifier; and
a second switch is configured to connect the output node of the negative voltage source to a component on the chip.

19. The apparatus of claim 16, further comprising:
means for calibrating the negative voltage source based on a relationship between the corrected measurements and the digital values.

20. The apparatus of claim 16, wherein the first stage comprises:
an operational amplifier;
a first capacitor connected in series between the negative voltage source and an inverting input node of the operational amplifier;
a feedback path connecting an output node of the operational amplifier to the inverting input node; and
a second capacitor connected between the feedback path and ground, wherein a gain of the first stage is a function of a ratio of a capacitance of the second capacitor to a capacitance of the first capacitor.

* * * * *